United States Patent [19]
Betts et al.

[11] Patent Number: 5,894,282
[45] Date of Patent: Apr. 13, 1999

[54] FLOATING TRIANGLE ANALOG-TO-DIGITAL CONVERSION SYSTEM AND METHOD

[75] Inventors: Jonathan Noble Betts, San Francisco; John Robert Haggis, San Jose; Edwin Joseph Selker, Palo Alto; Barton Allen Smith, Campbell, all of Calif.

[73] Assignee: International Business Machines Corporation, Armonk, N.Y.

[21] Appl. No.: 08/773,420

[22] Filed: Dec. 27, 1996

[51] Int. Cl.$^6$ .................................................. H03M 1/60
[52] U.S. Cl. ........................................ 341/157; 341/166
[58] Field of Search .................................. 341/155, 166, 341/157

[56] References Cited

U.S. PATENT DOCUMENTS

| | | | |
|---|---|---|---|
| 3,859,603 | 1/1975 | Herzner | 328/181 |
| 3,918,050 | 11/1975 | Dorsman | 340/347 |
| 4,041,386 | 8/1977 | Thomas et al. | 324/77 |
| 4,112,428 | 9/1978 | Dorsman | 340/347 |
| 4,164,733 | 8/1979 | Landsburg et al. | 340/347 |
| 4,220,925 | 9/1980 | Wu | 328/150 |
| 4,291,297 | 9/1981 | Kanemaru et al. | 340/347 |
| 4,381,498 | 4/1983 | Goodale | 340/37 |
| 4,518,948 | 5/1985 | VanRoessel | 340/347 |
| 4,598,270 | 7/1986 | Shutt et al. | 340/347 |
| 4,667,065 | 5/1987 | Bangerter | 379/351 |
| 5,045,800 | 9/1991 | Kung | 328/59 |
| 5,084,704 | 1/1992 | Parrish | 341/164 |
| 5,189,421 | 2/1993 | Daugherty | 341/157 |
| 5,321,404 | 6/1994 | Mallinson et al. | 341/169 |

*Primary Examiner*—Howard L. Williams
*Assistant Examiner*—Peguy JeanPierre
*Attorney, Agent, or Firm*—Gray Cary Ware Freidenrich

[57] ABSTRACT

An analog-to-digital converter utilizing pulse width modulation and ramp and count techniques. A microcontroller generates the pulse width modulated digital signal which is converted into a floating triangle. When the floating triangle signal is equal to the analog, input signal, a comparator generates and output which is sensed by the microcontroller. During an initialization process, the microcontroller uses information with respect to the timing of the comparator output to adjust the duty cycle so that the triangle wave remains within maximum and minimum levels above and below the analog, output signal. Calculation of the voltage, of the input signal is made as a function of the timing of the comparator outputs on successive upward ramps of the floating triangle signal, and of the slope of the upward ramp signal. As a result, the analog-to-digital converter utilizes the same process for low and high resolution measurements, thereby significantly decreasing its cost and increasing its speed.

18 Claims, 6 Drawing Sheets

FLOATING TRIANGLE ANALOG-TO-DIGITAL CONVERSION SYSTEM AND METHOD

BACKGROUND OF THE INVENTION

1. Field of the Invention

The present invention relates generally to analog-to-digital converters and, more specifically, to an analog-to-digital converter which utilizes pulse width modulation combined with ramp and count techniques.

2. Description of the Related Art

In order for a digital computer to process information, it must receive the information in a digital form. When the information originates in an analog form, it must be converted into a digital representation before processing by the computer. This conversion is usually performed by an analog-to-digital converter (ADC).

ADCs are widely used in many applications as input devices for digital computers. Dedicated analog-to-digital converters are available which offer high speed and resolution. However, such devices, typically 16 bit devices, are relatively expensive. Thus, in many applications it is desired to achieve high speed, high resolution analog-to-digital conversion at a relatively low cost.

Some ADC techniques do not require dedicated analog-to-digital devices, and thus, can perform analog-to-digital conversion at a reduced low cost. One example of a technique for using a high speed microcontroller to achieve an 8 bit analog-to-digital conversion is taught in U.S. Pat. No. 5,189,421. This Patent discloses an analog-to-digital conversion technique which sweeps the duty cycle of a square wave generated by a microprocessor. A resister and capacitor convert the sweeping duty cycle into a sweeping voltage. When this voltage crosses the analog input voltage, a comparator trips, and the conversion is complete. The input voltage can be calculated from the duty cycle. This technique avoids the necessity of a separate dedicated ADC device, since its CMOS microcontroller may also be used for other control functions. However, techniques such as this one have a number of drawbacks. For example, in order for this technique to have high resolution (e.g., sub-millivolt resolution), it would have to use a very slow square wave, thereby slowing the conversion process.

There are numerous other techniques for accomplishing analog-to-digital conversion. These include parallel encoder (flash encoder), successive approximation, voltage to frequency conversion, single slope integration, charge balancing techniques, dual slope integration, delta sigma converters, and switched-capacitor converters. All of these ADCs have advantages and disadvantages. However, for some low cost applications, none of these techniques offers a satisfactory combination of speed, resolution, dynamic range and cost.

For example, these approaches typically use different hardware and different processes for the low resolution and high resolution portion of the analog-to-digital conversion. That is, generally, the conversion process takes place in two steps: first a low resolution determination (high order bits) measurement is made and then a high resolution (low order bits) is made. This is often necessary in applications where a small signal is superimposed on a larger offset voltage. The use of different hardware and different processes for these two steps adds significantly to the time required to accomplish the conversion, thereby reducing the converter speed. In addition, because these two steps are typically performed by different sets of hardware, the overall cost of the analog digital converter is increased accordingly. One of many examples of an application requiring high speed and low cost and where a small signal is superimposed on a larger offset voltage is the use of an analog-to-digital converter to measure the force that a user applies to a computer input device.

From the discussion above, it should be apparent that there is a need for an analog-to-digital converter that is fast, has high resolution, a wide dynamic range, and is low in cost. To reduce cost, there is a need for a technique for implementing an analog-to-digital converter which does not require a dedicated ADC circuit. In this regard, for example, it would be desirable to provide an analog-to-digital conversion technique which can be implemented on a low cost microcontroller in a way that other functions, besides analog-to-digital conversion, can also be performed by the microcontroller. It also would be desirable to provide an analog-to-digital converter which utilizes the same hardware and the same process for both high and low resolution portions of the analog-to-digital conversion process.

In order to increase the speed of an analog-to-digital converter, it would be desirable to provide an ADC that does not require the high and low resolution portions of the conversion process to be performed sequentially, but permits both of these processes to proceed at approximately the same time. Also, it would be desirable to provide an analog-to-digital converter that is able to quickly measure small signals superimposed on a larger offset voltage. The present invention satisfies these needs.

SUMMARY OF THE INVENTION

In accordance with the present invention, a system and method for performing analog-to-digital conversion is provided. The technique is well suited for low cost applications where an inexpensive microcontroller, that is used for other control functions, can also be used to implement the conversion process of the invention. In a preferred embodiment of the present invention, a digital signal is first converted into a ramp signal by a microcontroller. The duty cycle of the digital signal is adjusted by the microcontroller to provide a DC average voltage of the ramp signal that is near that of the input analog signal to be measured. The microcontroller then determines the precise time at which the instantaneous voltage of the ramp signal equals that of the input analog signal based on a comparator output. By knowing the slope of the upward ramp signal, the instantaneous voltage of the input analog signal at the time that it equals the ramp signal can be calculated by the microcontroller based on this measured time. A digital representation of this analog input voltage is then generated by the microcontroller as output.

In another embodiment of the present invention, a method for converting an analog signal into a digital signal is provided. The method includes the steps of generating digital signal outputs from a microcontroller comprising on and off signals. A rising ramp signal is generated in response to the on signal, and a falling ramp signal is generated in response to the off signal. An initialization step is performed by determining the time when the rising ramp signal equals the instantaneous voltage level $V_{in}$ of the input analog signal. Upper and lower voltage ranges $V_{max}$ and $V_{min}$ for the ramp signal are determined based on this time. For example, the upper and lower ranges may be set at the ramp voltage occurring a predetermined time before and after $V_{in}$. The digital signal is then adjusted so that subsequent on cycles begin when the falling ramp signal reaches $V_{min}$ and ends when the rising ramp signal reaches $V_{max}$. After initialization, the time it takes for the rising ramp signal to go from $V_{min}$ to $V_{in}$ is repeatedly measured, and a digital output is generated representing each $V_{in}$, where $V_{in}$ is calculated as a function of the measured time.

By using the same process for low resolution and high resolution measurements, the present invention greatly increases the speed of the conversion process. This also reduces the number of components necessary, which also reduces the cost. Cost is also minimized because an inexpensive microcontroller (that may also perform other functions) can be used to implement the conversion process with, for example, 8 bit accuracy. Because the present invention can make rapid conversions within an adjustable narrow input voltage range it is well suited to applications involving the measurement of small signals (sub-millivolt) that are superimposed on a larger, varying, offset voltage.

Other features and advantages of the present invention should be apparent from the following description of the preferred embodiment which illustrates, by way of example, the principles of the invention.

DETAILED DESCRIPTION OF THE PREFERRED EMBODIMENTS

The present invention is an analog-to-digital converter which operates in an adjustable and narrow conversion range that is defined by the excursion of a small-amplitude triangle wave. The triangle wave is created by a duty cycle modulated digital signal. The upward ramp of the triangle is timed until it reaches a comparator threshold with the input signal. The voltage of the input signal can be calculated as a function of this measured time. As a result, the nature of this conversion process, the supporting circuitry to the microcontroller requires far fewer components than standard ADC designs.

Figure 1:
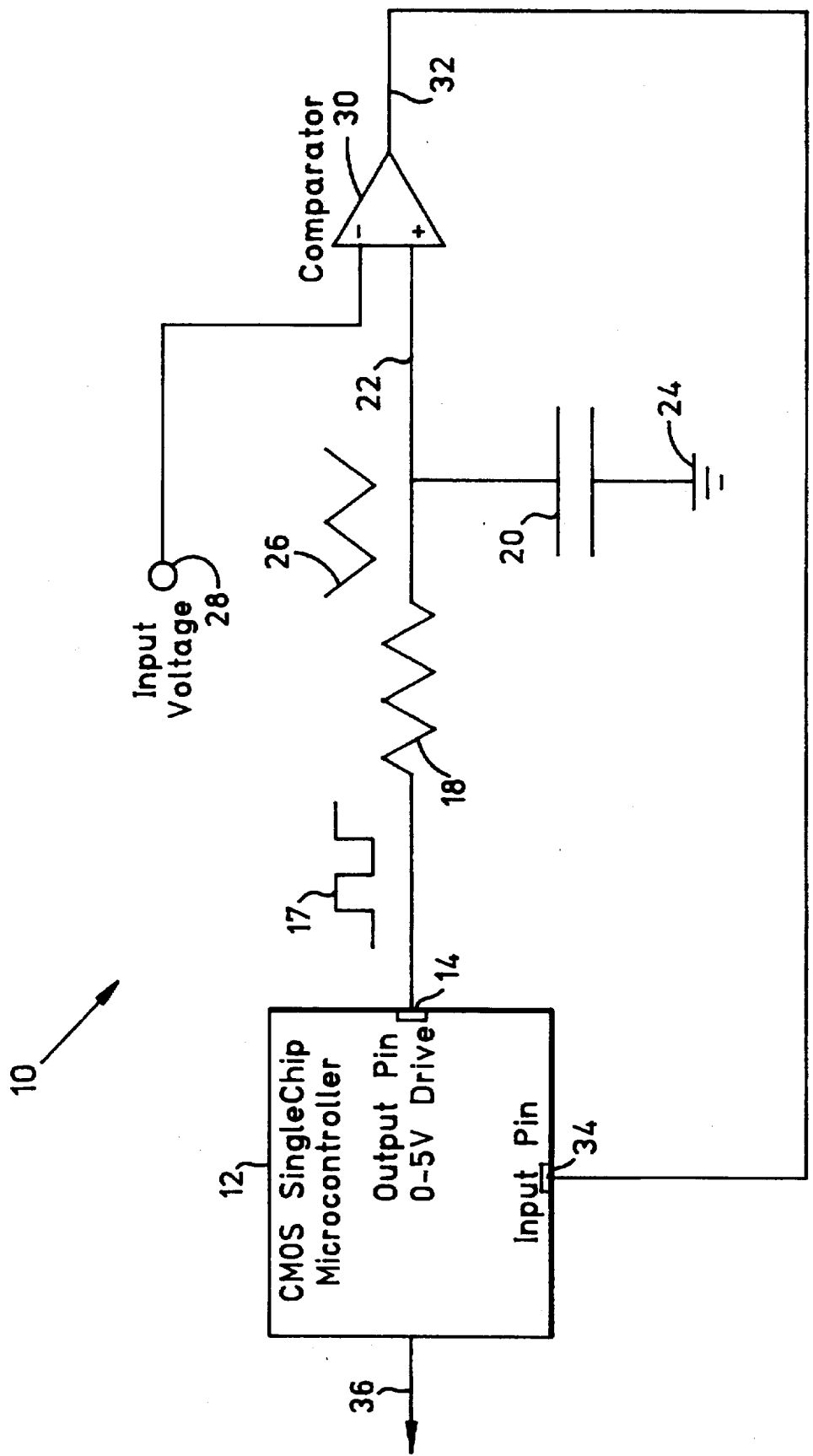
FIG. 1 is a block diagram of an analog-to-digital converter in accordance with a preferred embodiment of the presentation invention.

Referring now to FIG. 1 there is shown a block diagram of the electronic hardware of an analog-to-digital converter in accordance with a preferred embodiment of the present invention. The analog-to-digital converter 10 includes a microcontroller 12 which may comprise, for example, a CMOS single chip microcontroller such as a Phillips Corp. 80C752 device. The microcontroller 12 switches one of its digital outputs 14 between 0 and $V_{ref}$ at a frequency that is appropriate for the application at hand. For example, trackpoint digital applications would require a frequency in the range of 40 Hz to 200 Hz to convert mouse movement. The resulting digital output 16 is a square wave, shown at 17, which is coupled to a resister 18 and a capacitor 20 as illustrated. The resulting square wave 17 will cause the voltage on the capacitor, measured between line 22 and ground 24, to ramp approximately linearly between a minimum and maximum voltage. This creates a triangle wave 26. The switching frequency is chosen in combination with the values of resister 18 and capacitor 20 so that the comparator voltage 22 changes a small fraction of $V_{ref}$ during each cycle.

During an initialization procedure, described in more detail below, the high-low duty cycle of the digital output 16 is adjusted by the microcontroller 12 to charge the capacitor 20 to an average voltage that is equal to the nominal signal voltage to be measured. In particular, this input signal voltage ($V_{in}$) is fed to an analog-to-digital converter input 28. The capacitor voltage (also referred to as the comparison voltage) 22 is fed to one input of a comparator 30, while the input voltage $V_{in}$ at 28 is fed to the inverting input of the comparator 30. The comparator 30 will generate an output at line 32 which changes state each time the comparison voltage 22 equals the input voltage 28. In particular, during each digital cycle 16 the comparison voltage will cross the signal voltage $V_{in}$ twice, and each time it does this the output of the comparator 30 will change state at line 32. Comparator output 32 is then fed to an input 34 of the microcontroller 12. The microcontroller 12 determines the input voltage $V_{in}$ relative to $V_{ref}$ based on the time at which the comparator output 32 changes state.

In a preferred embodiment of the present invention, microcontroller 12 is a Phillips 80C752 device. The values of the resister 18 and the capacitor 20 are selected according to the application. The comparator 30 may be incorporated into the microcontroller 12 or it may be a separate device such as the LM311 comparator manufactured by Texas Instruments.

The initialization process is similar to the measurement process except that the switching frequency is lower so that the comparison voltage will ramp over the full range of possible input voltages, that is, from zero to $V_{REF}$.

Figure 2:
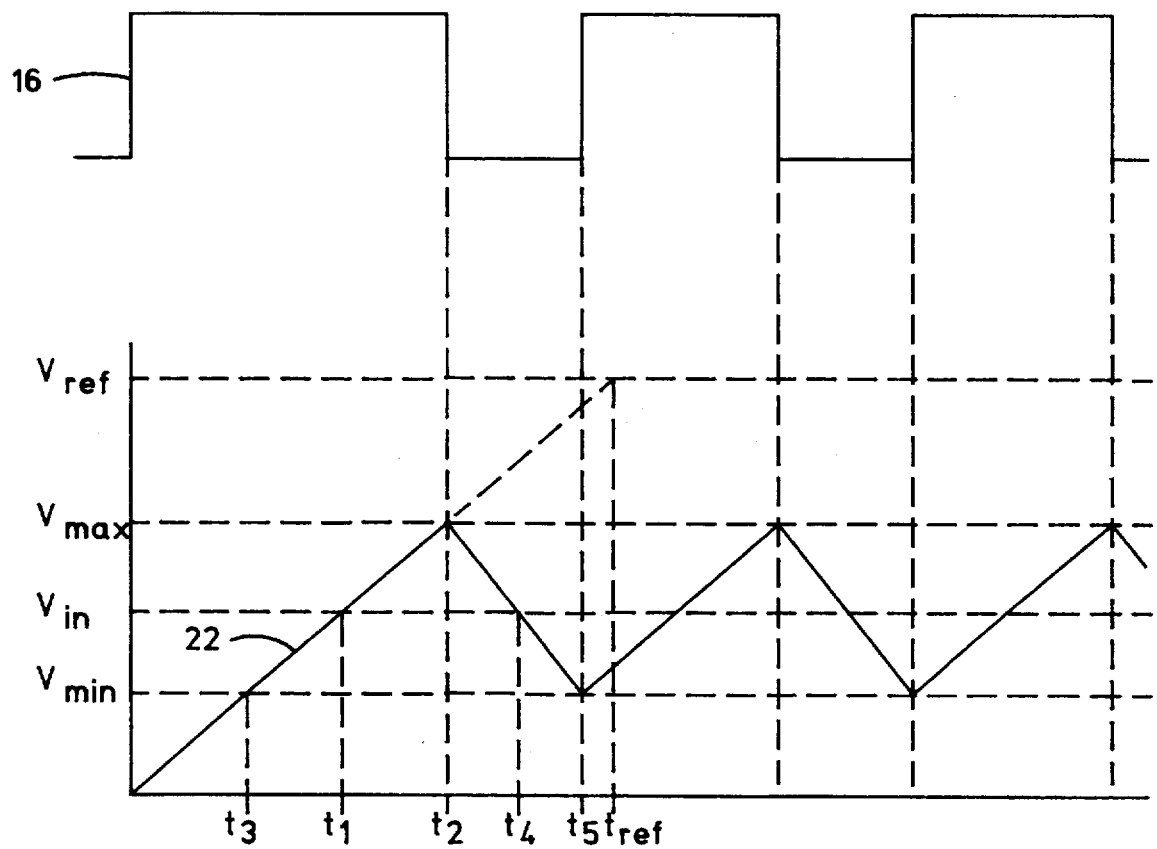
FIG. 2 is a diagram of the voltage of the comparison signal as a function of time during the floating triangle conversion process of the present invention.

Referring now to FIG. 2, the triangle wave of the comparison voltage 22 is shown during the initialization process. FIG. 2 contains a diagram of the voltage of the comparison signal voltage 22 during the initialization and measurement processes. The digital output 16 is also illustrated.

FIG. 2 shows the comparison voltage 22 commencing with the beginning of an initialization on cycle of the square wave 17. At time $t_o$ the on cycle begins with the digital output 16 going high causing the triangle wave 26 to begin its upward ramp. Also, the microcontroller 12 begins to sample the comparator output at input 34. When the comparison voltage 22 equals the input signal voltage ($V_{in}$) 28, at time $t_1$, the comparator 30 generates an output. The microcontroller 12 will then continue the on cycle for 128 counts. That is, the on cycle continues for 128 clock cycles, which, for example, occur at a rate of 200 KHz in the microcontroller 12. The on cycle ends at time $t_2$. The voltage at this point is referred to as $V_{max}$. As a result, the switch point $t_1$ will be appropriately in the middle of a 256-count ramp, there being 128 counts between $t_1$ and $t_2$ and 128 counts between $t_1$ and $t_3$.

At $t_2$ the microcontroller 12 drives the comparison voltage 22 low and counts from this point until the comparator 30 signals that the comparison voltage 22 has crossed back below the input voltage. This will coincide with another output of the comparator 30. This is $t_4$ in FIG. 2. The microcontroller 12 continues the off cycle for a time which equals the same number of counts measured between $t_2$ and $t_4$. This places $V_{in}$ at the midpoint between $V_{max}$ and $V_{min}$. At this point, $t_5$, the off cycle ends. The total time of the off cycle therefore is the number of counts between $t_2$ and $t_5$. This completes the initialization process. The ADC 10 will then begin the measurement process.

However, it should be noted that if during the measurement phase, the nominal digitized output 34 drifts out of a predetermined digitizing range, the microcontroller 12 can re-initialize the analog-to-digital converter 10. The range which is used to trigger re-initialization may comprise, for example, upper and lower thresholds which indicates that $V_{in}$ is approaching $V_{max}$ and $V_{min}$ to within a given number of counts. This may occur at any time during the operation of the analog-to-digital converter 10 due to drifting of the input voltage. When this digitizing range is exceeded, the microcontroller 12 will reinitialize by driving the comparison voltage 22 more than 128 counts below the old comparator switch point $V_{in}$ and repeating the above initialization process. Reinitialization is described in more detail below with reference to FIG. 6.

During steady state measurement operation of the digital-to-analog converter 10, the microcontroller 12 cycles the output 16 high and low for the calibrated on and off times and repeatedly samples the comparator input 34 to determine conversion time during the up ramp. This conversion time is then readily converted into a voltage $V_{in}$. For example, from the values of the resister 18 and capacitor 20, the slope of the up ramp 26 can be calculated. Alternatively, the slope of ramp 22 may be determined empirically by determining the time $t_{ref}$ for the ramp to proceed from 0 to $V_{ref}$ since $V_{ref}$ is known.

In any event, once the slope of the upward ramp 22 is known the instantaneous voltage $V_{in}$ can be calculated. This may be done, for example, by using the expression:

$$V_{in} = ST_1$$

where $T_1$ is the time at which the comparator sends an output and S is the slope of the up ramp, derived from the ratio of $V_{ref}$ to $t_{ref}$ or calculated from the resistor 18 and comparator 20 values. Once the microcontroller 12 has determined $V_{in}$ it can generate a digital output representing this value at line 36. Alternatively, where microcontroller 12 is performing other functions besides analog-to-digital conversion, the instantaneous value of $V_{in}$ will simply be used internally (for generating a control signal, for example,) and there will be no direct digital output 36 representing $V_{in}$.

Also shown at the top of FIG. 2 is a diagram of the square wave 16 during the initialization and measurement phases. More specifically, when digital output 16 goes high, ramp 22 proceeds from 0 volts to $V_{max}$. At that time, $t_2$, the digital signal 16 goes off for a period of time determined in the initialization process discussed above. At the end of the initialization ramp 22 has reached $V_{min}$ and the square wave 38 goes on again for an on time as calculated during the initialization process. The square wave 16 will then repeat these on times and off times so as to maintain the ramp wave 26 as a triangle wave between $V_{max}$ and $V_{min}$, until initialization is performed again.

Figure 3:
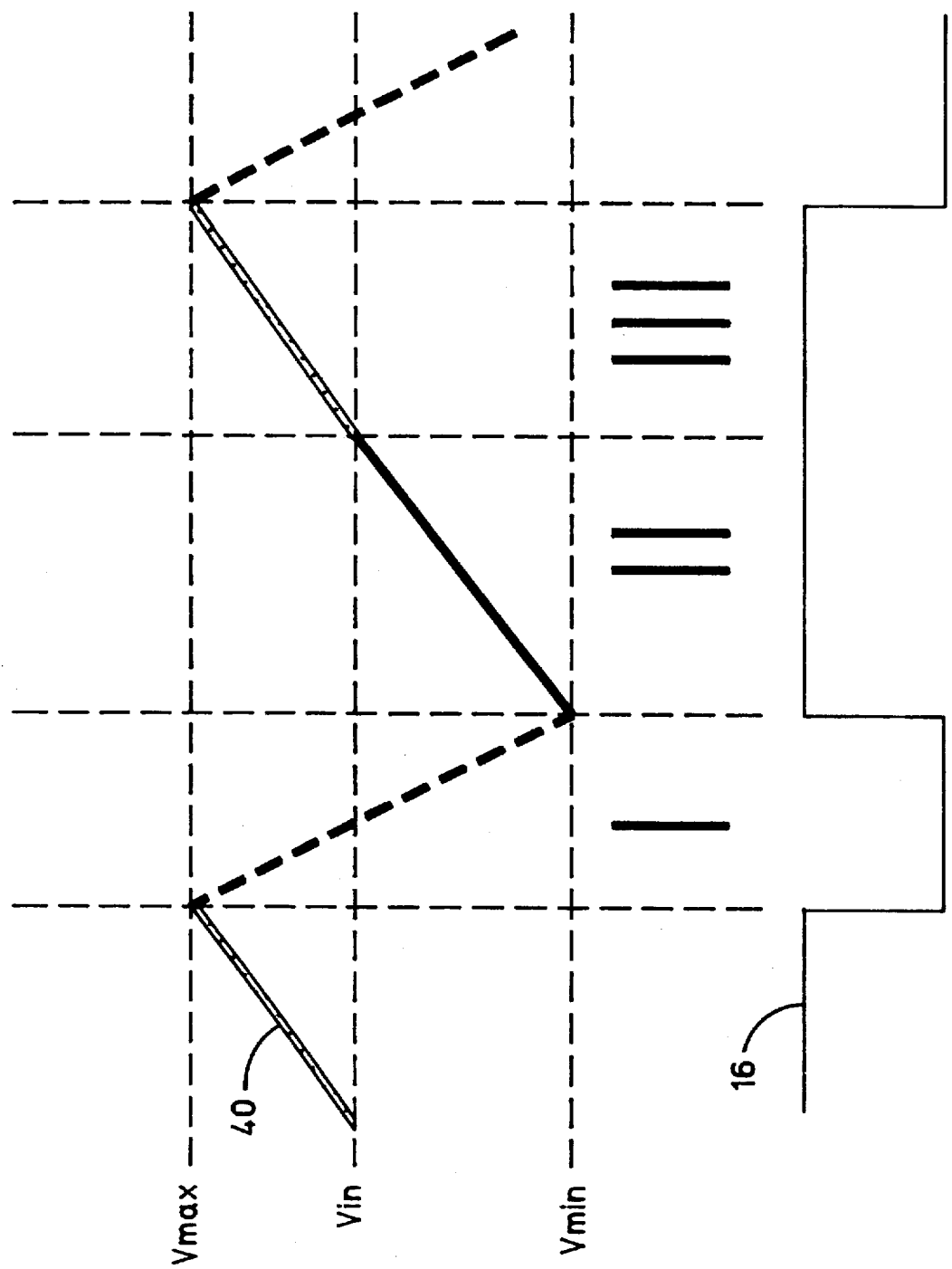
FIG. 3 is a diagram of the voltage of the comparison signal during the three phases of the measurement process.

In the measurement phase the microcontroller 12 cycles the capacitor voltage 22 high and low for the calibrated on and off times and samples the comparator input to determine the voltage $V_{in}$ during each up ramp. This is accomplished in three distinct phases: discharge, measurement, and ramp up. FIG. 3 illustrates a floating triangle wave 40 during these three distinct phases, beginning with the capacitor voltage 22 at $V_{max}$ (attained at the end of the 256 count ramp). In Phase One the microcontroller 12 discharges the capacitor to the bottom of the ramp at $V_{min}$. This coincides with an off cycle of the square wave 16 shown in FIG. 2. That is, the microcontroller 12 times out the discharge period to be equal to the off time calculated above in the initialization process.

Phase Two is the measurement phase. It begins with the capacitor 20 at $V_{min}$ when the microcontroller 12 begins another on cycle, which drives the comparison voltage 22 high. The microcontroller 12 measures time (number of counts) until the comparison voltage 22 crosses the input voltage and the comparator 30 switches high. This causes the comparator output 32 to be received by the microcontroller 12. Since the count-up time has been calibrated to give 256 counts to $V_{max}$ the number of counts from $V_{min}$ to the comparator switch point will yield the desired digital value of $V_{in}$. Various ways of calculating the $V_{in}$ have been discussed above.

Phase Three, the ramp-up phase, begins immediately after the comparator 30 switches high. In Phase Three the controller 12 finishes charging the capacitor to $V_{max}$ by counting from the current value the rest of the way to 256 counts to complete the on cycle. The cycle then repeats by beginning Phase One again. Also shown in FIG. 3 is the digital signal 16 driven by the microcontroller 12. Note that the off time is shorter than the on time in FIG. 3. It is shown this way to simply illustrate that the off times and on times are not necessarily the same length when calculated during the initialization process. Factors causing the on and off time to be different include analog value being compared with, and the change (if any) in that analog value.

As discussed above, at any time $V_{in}$ may drift close to or beyond $V_{max}$ or $V_{in}$. When this occurs, a threshold set by microcontroller 12 will detect this occurrence. For example, this threshold may be set to detect when $V_{in}$ comes within 50 counts of $V_{max}$ or $V_{min}$ during the 256 count on cycle. When this occurs, the microcontroller 12 will reinitialize the analog-to-digital converter 10. That is, the microcontroller 12 will drive the ramp voltage 22 more than 128 counts below the old comparator switch point and repeat the initialization process. For example, depending on the particular nature of drift in the system, the microcontroller may begin initialization at V=0 as in the first initialization shown in FIG. 2, or it may begin this process at predetermined distance below $V_{min}$.

Figure 4:
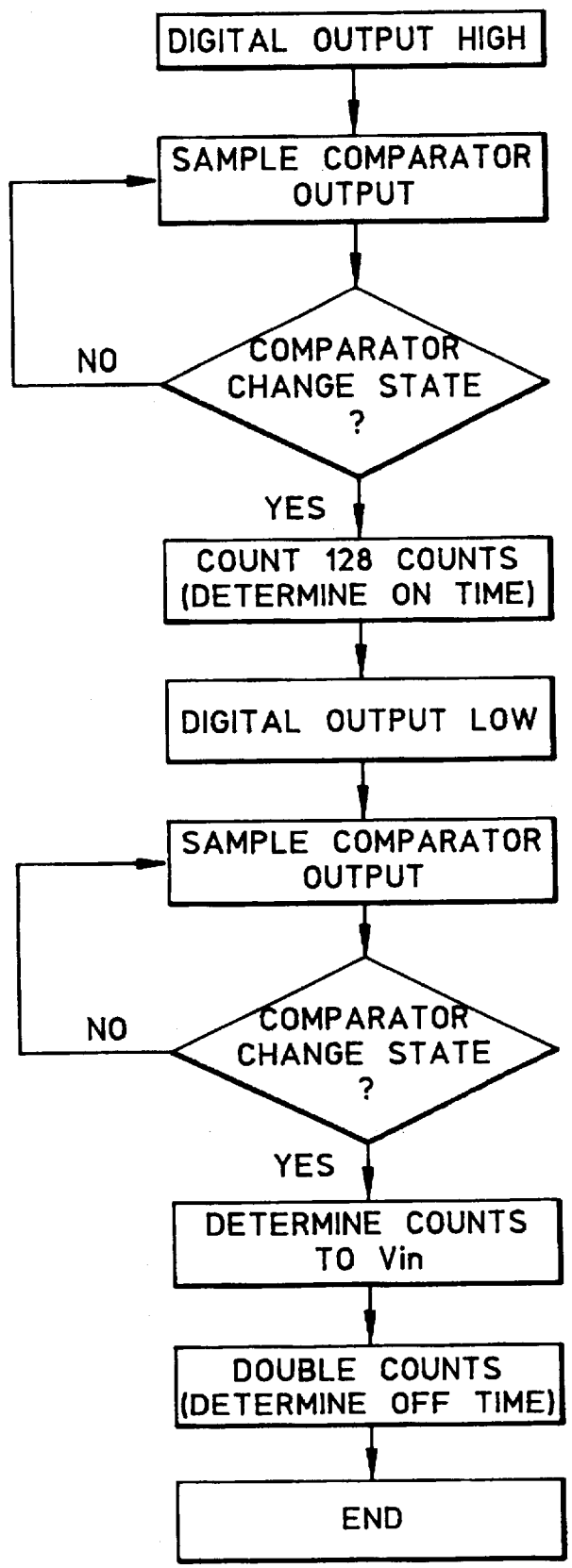
FIG. 4 is a flow chart of a preferred initialization process of the present invention for determining the low resolution measurement.

Referring now to FIG. 4 a flow chart of the basic steps performed during the initialization process is shown. First, the microcontroller drives the digital signal 16 high in step 46. The microcontroller 12 then begins sampling the comparator output, in step 48. In step 50, the microcontroller determines whether there has been a comparator output. If not, the sampling process continues. Once the comparator switches, the microcontroller detects it in step 50 and begins to count 128 counts in step 52. After 128 counts, the microcontroller 12 will drive the digital output 16 low, in step 54. At this point, the capacitor voltage is at $V_{max}$ and will begin to drop. The microcontroller then begins to sample the comparator output in step 56, and, checks to see if the comparator has switched in step 58. If not, the process proceeds back to continue sampling in step 50. Once the microcontroller detects a comparator output, it determines the number of counts it took to reach $V_{in}$ in step 60, and doubles that number of counts, in step 62, to determine the off time. At this point the initialization process is complete.

Figure 5:
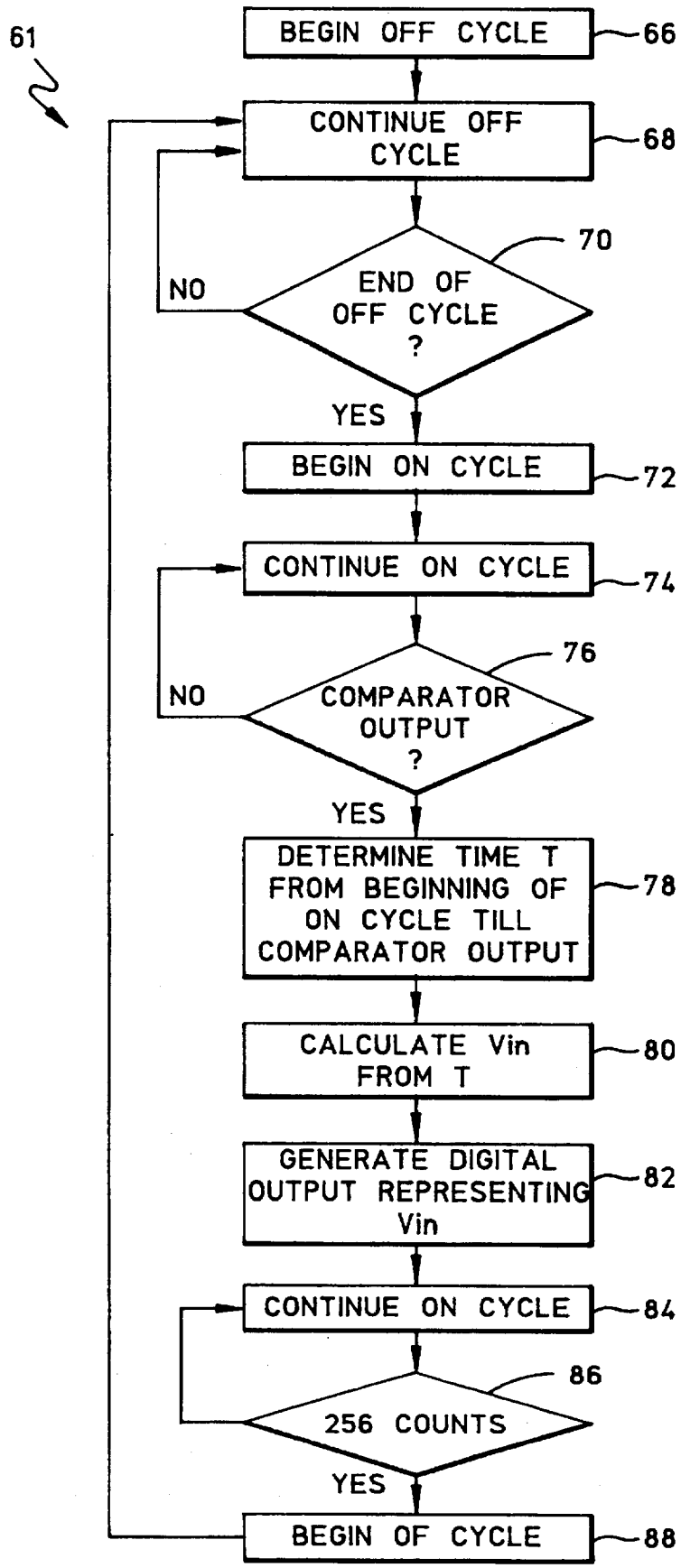
FIG. 5 is a flow chart of a preferred high resolution analog-to-digital conversion process of the present invention.

Referring now to FIG. 5 a flow chart 64 of the measurement process during operation of the analog-to-digital converter is shown. In step 66 Phase One, shown in FIG. 3, is begun as the off cycle begins. The off cycle is continued, in step 68, and the microcontroller determines whether the off cycle is over, in step 70, based on the number of counts calculated during initialization. If not, the process proceeds back to step 68 to continue the off cycle. Once it is determined, in step 70, that the off time has been reached, the system begins the on cycle which begins Phase Two, shown in FIG. 3, at step 72. At step 74 the on cycles continue. Next, in step 76, the microcontroller begins to sample the comparator output and, if there is no output, the on cycle continues, in step 74. Once a comparator output is detected, the system will determine the time from the beginning of the on cycle to this point, in step 78.

The microcontroller will calculate $V_{in}$ based on this time in step 80. Next, the microcontroller 12 can generate a digital output representing $V_{in}$ in step 82 or utilize $V_{in}$ in another manner, depending on the application. Beginning Phase Three, the on cycle will then continue in step 84, and will determine whether the on time has reached 256 counts, in step 86. If not, the on cycle continues in step 84. Once 256 counts has been reached, the off cycle begins, step 88, and Phase One begins again. That is, the analog-to-digital converter 10 then proceeds back to step 66 to continue Phase One.

Figure 6:
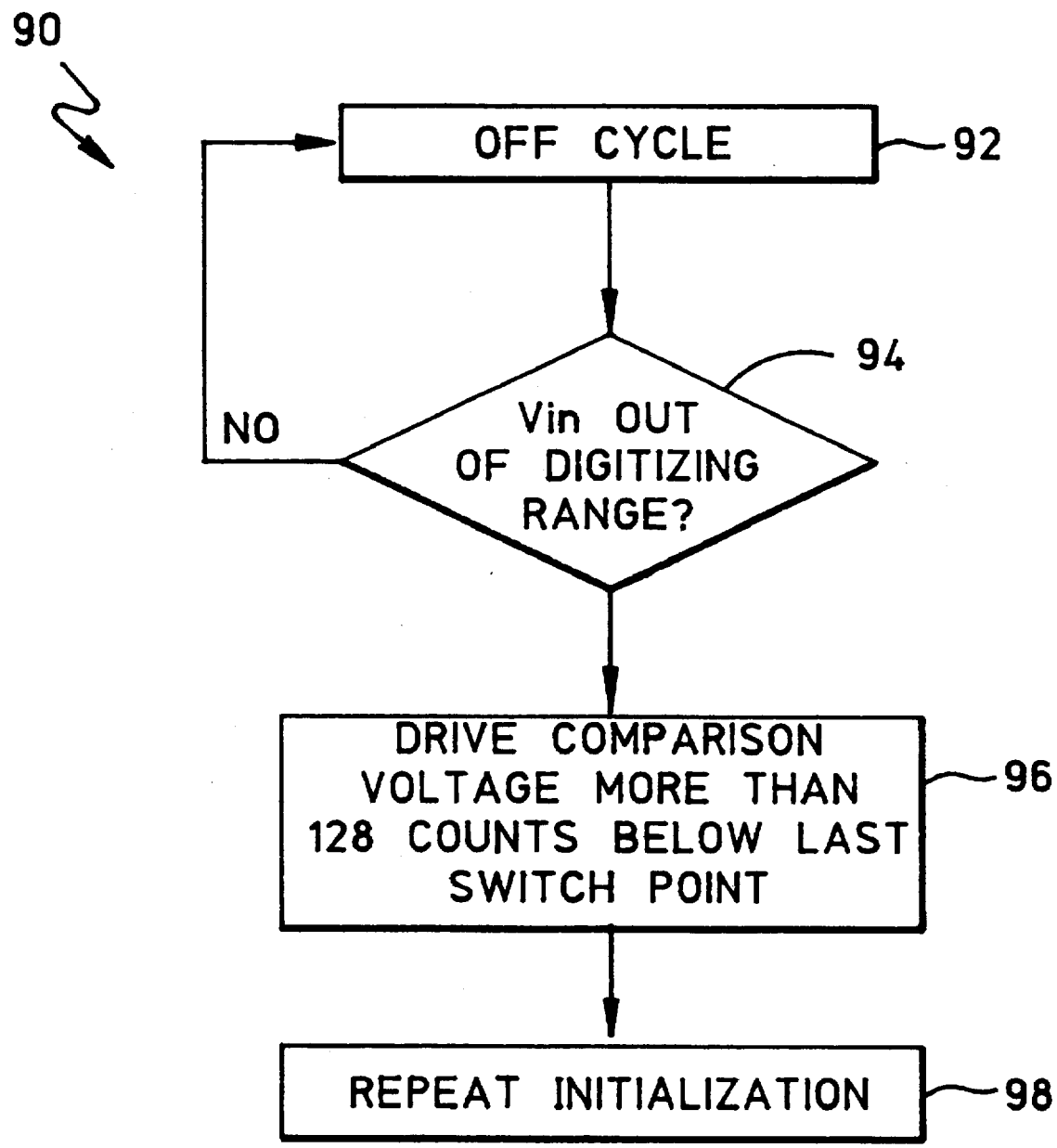
FIG. 6 is a flow chart of a preferred reinitialization process of the present invention.

Referring now to FIG. 6, a flow chart of the re-initialization process 90 is shown. In the preferred embodiment, this process will be performed during each off cycle. It should be noted however, that this process may be performed during the on cycle and also may be performed periodically at other intervals. In any event, the reinitialization process 90 begins with step 92 with the digital-to-analog converter in Phase One, the off cycle. Next, in step 94, the system determines if the most recent digitized output 36 ($V_{in}$) is outside a predetermined range. If not, the system proceeds back to step 90.

If $V_{in}$ is outside the predetermined range, then step 96 will drive the comparison voltage 22 more than 128 counts below the previous comparison switch point by continuing the off cycle for longer than the existing off time. The amount below $V_{in}$ will depend on application specific factors such as expected drift. In any event, the comparison voltage 22 will be driven to a point between zero and $V_{in}$. At this point, the initialization process is repeated, step 90. This consists of steps 46-62. Shown in FIG. 4.

In summary, what has been disclosed herein is an analog-to-digital converter that utilizes the same hardware and process to perform both low resolution and high resolution measurements. It does this by a technique for performing analog-to-digital conversion utilizing a floating point triangle signal. The present invention is easily performed on a low cost microcontroller that can also be used for other purposes. The result is an ADC that is low in cost, fast and yields high resolution.

It should be understood that this invention may be embodied in other specific forms without departing from its spirit or essential characteristics. The above-described embodiments of the present invention are to be considered in all respects only as illustrative and not restrictive in scope. The scope of the invention is therefore indicated by the appended claims rather than by the above-detailed description. Therefore, all changes within the meaning and range of equivalency of the claims are to be considered embraced within their scope.

What is claimed and desired to be secured by U.S. Letters Patent is:

1. A method for converting an analog signal into a digital signal, comprising the steps of:

generating a digital signal with an on and off cycles;

generating a triangle signal in response to the digital signal, the triangle signal including rising ramps and falling ramps;

receiving an input analog signal;

measuring a first time T at which a first rising ramp equals the voltage level ($V_{in}$) of the input analog signal;

determining upper ($V_{max}$) and lower ($V_{min}$) voltage levels based on the first time T;

terminating each off cycle and beginning each on cycle when $V_{min}$ is reached by a falling ramp;

terminating each on cycle and beginning each off cycle when $V_{max}$ is reached by a rising ramp;

during successive on cycles, repeatedly measuring a second time T that it takes for a rising ramp to go from $V_{min}$ to $V_{in}$; and generating a digital output representing $V_{in}$, calculated as a function of the second time T.

2. The method of claim 1 wherein the beginning of each of the on and off cycles is controlled by adjusting a duty cycle of the digital signal.

3. The method of claim 1 wherein the step of measuring the first time T comprises the steps of:

comparing, $V_{in}$ with the voltage level of the first rising ramp in a comparator; and generating an output of the comparator when the voltage level of the first rising ramp equals $V_{in}$.

4. The method of claim 3 wherein the step of determining $V_{max}$ comprises the step of:

ending an on cycle a predetermined period of time after the comparator generates the output, whereby $V_{max}$ is the voltage level of the rising ramp at the end of the on cycle.

5. The method of claim 1 wherein the length of each off cycle is determined by:

measuring a time T2 required for the rising ramp to equal $V_{in}$; and calculating the length of the off cycle as two times the time T2.

6. The method of claim 1 wherein the step of generating a triangle signal includes generating a rising ramp by charging a capacitor with the digital signal.

7. The method of claim 1 wherein the step of determining $V_{max}$ and $V_{min}$ includes counting a predetermined period of time after the rising ramp reaches $V_{in}$ and setting $V_{max}$ at that level.

8. The method of claim 7 further comprising the steps of determining if $V_{in}$ is within a predetermined distance of $V_{min}$ and $V_{max}$ and, if so, increasing the time of an off cycle to allow the falling ramp to go below $V_{min}$, and repeating the step of determining $V_{max}$ and $V_{min}$.

9. The method of claim 7 further comprising the step of:

causing the duration of each on cycle to be two times the predetermined period of time after the rising ramp reaches $V_{in}$.

10. The method of claim 1 further comprising the step of calculating a slope of the rising ramp; and wherein the step of generating a digital output including calculating $V_{in}$ as a function of the second time T and of the slope of the rising ramp.

11. An analog-to-digital converter, comprising:

means for providing a digital signal having a duty cycle including on and off states;

means for converting the digital signal into a triangle signal which increases in voltage during a digital on state, and decreases in voltage during a off state;

means for receiving an analog input signal;

a comparator receiving both the triangle signal and the analog input as inputs, and generating an output signal only when the voltage of the triangle signal and the analog signal are equal;

means for sensing a time T when the comparator generates the output signal determining the voltage level $V_{in}$ of the triangle signal at that time T;

initializing means coupled to the means for providing and the means for sensing, for modifying the duty cycle of the digital signal so that the triangle signal will be within a predetermined range above and below $V_{in}$; and measurement means coupled to the initializing means for generating digital outputs representing instantaneous values of $V_{in}$ for successive on states of the digital signal.

12. The converter of claim 11 wherein the means for providing, means for sensing, initializing means and the measurement means comprise a programmable microcontroller.

13. The converter of claim 11 wherein the means for converting comprises an integrator.

14. The converter of claim 13 wherein the integrator includes a capacitor that charges during the on states and discharges during the off states.

15. The converter of claim 11 wherein the initializing means modifies the digital signal duty cycle so that each on state ends at a predetermined time after the comparator generates an output, wherein the voltage of the triangle signal is $V_{max}$ at the predetermined time.

16. The converter of claim 11 wherein the initializing means is for modifying the duty cycle so that each off state ends at a time which is twice the time measured from the beginning of the off state to the time that the comparator generates an output signal.

17. The converter of claim 11 wherein the means for sensing further comprises:

means for measuring a slope of the triangle signal; and means for calculating $V_{in}$ as a function of T and the slope.

18. An analog-to-digital converter comprising:

means for receiving an input analog signal;

microcontroller for generating a digital signal having on and off cycles;

an integrator circuit for converting the digital signal into a triangle signal with a rising ramp portion during each on cycle and a falling ramp portion during each off cycle;

a comparator receiving the analog signal and the triangle signal as inputs and producing an output only when the voltage levels of the two signals are the same;

the microcontroller being coupled to receive the comparator output and including programmed means for:

initializing a duty cycle of the digital signal so that the triangle signal will be within a first predetermined voltage level ($V_{max}$) above and below a second predetermined the voltage level $V_{min}$ of the triangle signal when the comparator generates the output;

determining a slope of the rising ramp portion;

measuring a time T it takes for the rising ramp portion to go from $V_{min}$ to $V_{in}$ and calculating the value of $V_{in}$ as a function of T and of said slope (S) using the expression;

$$V_{in} = S \times T;$$

and means for generating a digital output representing the value of $V_{in}$.

* * * * *

UNITED STATES PATENT AND TRADEMARK OFFICE
CERTIFICATE OF CORRECTION

PATENT NO. : 5,894,282
DATED : April 13, 1999
INVENTOR(S) : Betts et al

It is certified that error appears in the above-indentified patent and that said Letters Patent is hereby corrected as shown below:

On title page, add the following under [56] References Cited:

OTHER PUBLICATIONS

Horowitz et al., "THE ART OF ELECTRONICS", Second Edition, Cambridge University Press, pages 612-629

Signed and Sealed this

Fifth Day of October, 1999

Attest:

Q. TODD DICKINSON

*Attesting Officer*   *Acting Commissioner of Patents and Trademarks*